(12) United States Patent
Yabe et al.

(10) Patent No.: US 7,332,405 B2
(45) Date of Patent: Feb. 19, 2008

(54) METHOD OF FORMING ALIGNMENT MARKS FOR SEMICONDUCTOR DEVICE FABRICATION

(75) Inventors: Sachiko Yabe, Ibaraki (JP); Takashi Taguchi, Tokyo (JP); Minoru Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 231 days.

(21) Appl. No.: 11/048,891

(22) Filed: Feb. 3, 2005

(65) Prior Publication Data

US 2005/0186756 A1   Aug. 25, 2005

(30) Foreign Application Priority Data

Feb. 20, 2004   (JP) ............................. 2004-044788

(51) Int. Cl.
  *H01L 21/76*   (2006.01)
(52) U.S. Cl. .............................. 438/401; 257/E21.243; 257/E21.206; 257/E21.564
(58) Field of Classification Search ................. 438/401
  See application file for complete search history.

(56) References Cited

U.S. PATENT DOCUMENTS

| | | | |
|---|---|---|---|
| 5,369,050 A | | 11/1994 | Kawai |
| 6,368,936 B1 | | 4/2002 | Yoshida |
| 6,635,576 B1 | * | 10/2003 | Liu et al. .................... 438/700 |
| 6,664,165 B2 | * | 12/2003 | Koyama ..................... 438/311 |
| 6,673,635 B1 | | 1/2004 | Hellig et al. |
| 6,706,610 B2 | * | 3/2004 | Yoshimura et al. ......... 438/401 |
| 6,995,055 B2 | * | 2/2006 | Yoshida et al. ............. 438/199 |
| 7,045,837 B2 | * | 5/2006 | Egger et al. ................ 257/295 |
| 7,105,442 B2 | * | 9/2006 | Shan et al. ................. 438/681 |
| 2002/0146889 A1 | * | 10/2002 | Coolbaugh et al. ......... 438/401 |
| 2002/0182821 A1 | * | 12/2002 | Yabe et al. ................. 438/401 |

* cited by examiner

*Primary Examiner*—Michael Lebentritt
*Assistant Examiner*—Thu-Huong Dinh
(74) *Attorney, Agent, or Firm*—Volentine & Whitt, P.L.L.C.

(57) ABSTRACT

A semiconductor integrated circuit is fabricated in a substrate having a semiconductor layer and an underlying insulator layer. The fabrication process includes a step of locally oxidizing the semiconductor layer to form a field oxide, during which step the semiconductor layer is protected by a nitride film. The nitride film has both openings to permit local oxidization in the integrated circuit area, and an opening defining an alignment mark adjacent to the circuit area. The alignment mark may be formed either in the semiconductor and insulator layers, or in a part of the nitride film left after the nitride film is removed from the circuit area. In either case, the edge height of the alignment mark is not limited by the thickness of the semiconductor layer. Using the nitride layer to define both the alignment mark and the field oxide reduces the necessary number of fabrication steps.

19 Claims, 9 Drawing Sheets

METHOD OF FORMING ALIGNMENT MARKS FOR SEMICONDUCTOR DEVICE FABRICATION

BACKGROUND OF THE INVENTION

1. Field of the Invention

The present invention relates to a semiconductor device fabrication process, more particularly to the formation of alignment marks in the fabrication of, for example, silicon-on-insulator semiconductor devices.

2. Description of the Related Art

Semiconductor device fabrication processes typically include many photolithographic steps in which a film deposited on a semiconductor wafer is patterned to form elements of an integrated circuit. In these steps, the desired circuit pattern is first transferred to a photoresist by exposing the photoresist to light through a photomask and developing the photoresist. The photoresist then serves as an etching mask through which the film is etched in the desired pattern.

The photomask may be a glass plate on which the circuit pattern is defined with a material such as chrome that blocks light of the wavelength to which the photoresist will be exposed. An image of the circuit pattern may be formed on the photoresist by a reflective or transmissive optical scheme, with or without a reduction in size.

During the exposure process, it is essential for the photomask to be correctly aligned with the semiconductor wafer. One method of alignment is to position the wafer so that marks formed on the photomask and wafer are mutually aligned. The alignment marks formed on the wafer may be concave pits or trenches, convex mesas, or more complex relief patterns; such alignment marks can be detected from light reflected or diffracted from their edges.

Recently there has been much interest in silicon-on-insulator (SOI) semiconductor devices, in which transistors and other circuit elements are formed in a thin silicon semiconductor layer overlying an insulator layer in a semiconductor wafer. The thin semiconductor layer is divided into isolated active regions by a process such as local oxidation of silicon (LOCOS) or shallow trench isolation (STI). SOI devices can operate at high speed with low power consumption because the parasitic capacitance and junction leakage of their circuit elements is reduced. As ever higher levels of functionality and performance are required, the gate lengths of the transistors in SOI devices have been reduced to the point where it is necessary to form the transistors in a very thin semiconductor layer in order to suppress short channel effects.

This leads to alignment problems, however, because the step height of alignment marks formed in a very thin semiconductor layer is too small for adequate reflection or diffraction, making accurate detection of the alignment marks difficult.

U.S. Pat. No. 6,368,936 discloses a method of forming a semiconductor integrated circuit of the SOI type in which the alignment marks penetrate through the insulator layer as well as through the thin semiconductor layer. The alignment marks are formed in a separate process preceding local oxidation of silicon. Extra photolithography, etching, and alignment steps are therefore required.

U.S. Pat. No. 6,673,635 discloses another method of forming an SOI semiconductor integrated circuit in which the alignment marks penetrate the insulator layer, but the alignment marks are confined to the lower part of the insulator layer, and cannot take full advantage of the combined thickness of the semiconductor and insulator layers. In addition, although the alignment marks are formed during a conventional trench isolation process, this process must be preceded by a separate process that selectively etches the semiconductor layer and the upper part of the insulator layer.

U.S. Pat. No. 5,369,050 discloses a method of forming an SOI semiconductor integrated circuit in which convex alignment marks are surrounded by grooves that enhance their visibility, but the formation of the grooves also requires a separate process.

It would be desirable to have a method of forming alignment marks in a semiconductor integrated circuit of the SOI type that required a minimum of extra process steps.

SUMMARY OF THE INVENTION

An object of the present invention is to provide a method of fabricating a semiconductor device having alignment marks the positions of which can be detected with high accuracy.

Another object of the invention is to form such alignment marks with a minimum of extra fabrication steps.

The invented method of fabricating a semiconductor device starts by obtaining a substrate having a supporting layer, an insulator layer disposed on the supporting layer, and a semiconductor layer disposed on the insulator layer. The substrate includes at least one first area for formation of circuit elements and a second area in which an alignment mark will be formed adjacent the first area.

A nitride film is deposited on the substrate in both the first and second areas. The nitride film is patterned to form a first opening in the first area and a second opening in the second area. The first opening extends clear through the nitride layer; the second opening occupies at least an upper part of the nitride film. The semiconductor layer is locally oxidized below the first opening to form an isolation region in the first area. The substrate is then etched to form the alignment mark below the second opening.

In one embodiment, an oxide film is deposited on the substrate, and the nitride film is deposited on the oxide film. The second opening extends through the nitride film to the oxide film. The local oxidation process also oxidizes the semiconductor layer below the second opening. The etching process that forms the alignment mark removes the oxidized semiconductor layer and the insulator layer below the second opening. This etching process is preceded by the formation of a photoresist mask that covers the first area but exposes the second opening in the second area. Both the photoresist mask and the nitride layer are removed after the etching process, leaving the alignment mark as an opening in the semiconductor layer and insulator layer.

In another embodiment, the nitride film has a first thickness in the first area and a second thickness, greater than the first thickness, in the second area. This nitride film may be formed by depositing a first nitride layer on the substrate, removing the first nitride layer from the first area, then depositing a second nitride layer on the substrate. The second opening extends only partway through the nitride film. The etching process removes the nitride film from the first area, and reduces the thickness of the nitride film in the second area. The alignment mark is left as an opening in the remaining nitride film in the second area.

One function of the nitride film is to protect the semiconductor layer during the local oxidation process. By using the same nitride film to define the alignment mark, the invented fabrication method reduces the number of extra fabrication steps needed to form the alignment mark. The invention also

DETAILED DESCRIPTION OF THE INVENTION

Figure 1:
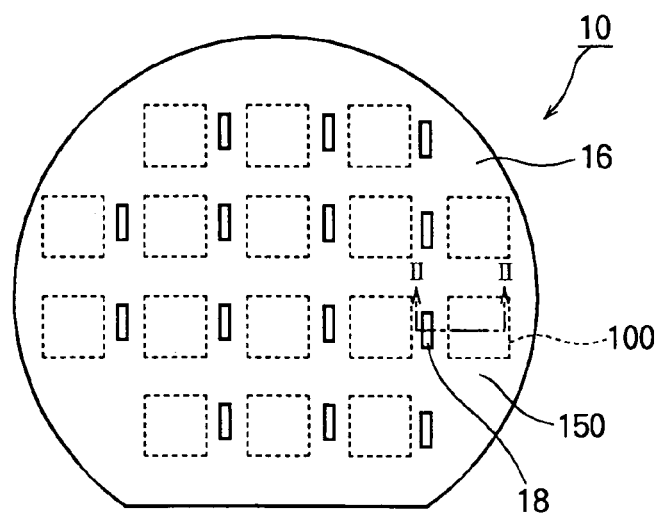
FIG. 1 is a plan view of a semiconductor wafer on which semiconductor integrated circuits are fabricated according to a first embodiment of the invention.

Embodiments of the invention will now be described with reference to the attached drawings, in which like elements are indicated by like reference characters. It should be kept in mind that the drawings depict the shapes, sizes, and positional relationships of the constituent elements schematically, to enable the invention to be understood, and that the invention is not limited to the examples shown in the drawings. Nor is the invention limited to the materials and processing conditions mentioned in the following description, which are given only as examples of preferred materials and conditions.

FIRST EMBODIMENT

Figure 2:
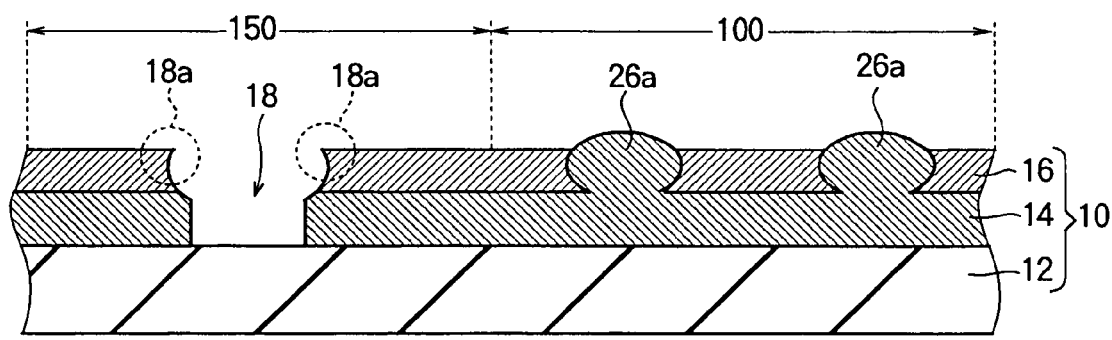
FIG. 2 is a sectional view through line II-II in FIG. 1.

Referring to FIG. 1A, in a first embodiment of the invention, semiconductor devices are fabricated on a substrate 10. Referring to FIG. 2, the substrate 10 is an SOI wafer comprising a first silicon (Si) layer 12 that serves as a supporting layer, a silicon oxide ($SiO_2$) insulator layer 14, and a monocrystalline second silicon layer 16 that serves as a semiconductor layer separated from the supporting layer 12 by the insulator layer 14. Referring again to FIG. 1, the substrate 10 includes a plurality of circuit areas 100 mutually separated by a mark area 150 in which concavities are formed as alignment marks 18. As seen in plan view, the alignment marks 18 have a rectangular shape in the present embodiment, but the invention is not restricted to this rectangular shape; the shape of the alignment marks 18, as well as the number of alignment marks 18 and their locations, may be varied according to the purpose for which they will be used and to other design considerations. Referring again to FIG. 2, each alignment mark 18 extends from the surface of the semiconductor silicon layer 16 to a depth adequate to expose the supporting silicon layer 12. In particular, the alignment mark 18 has edges 18a that extend entirely through the semiconductor silicon layer 16.

In the first embodiment, the semiconductor devices are fabricated as follows.

First, the substrate 10 is prepared by forming the insulator layer 14 and semiconductor silicon layer 16 on the supporting silicon layer 12. The insulator layer 14 is formed with a thickness of about one or two hundred nanometers (100-200 nm); then the semiconductor silicon layer 16 is formed with a thickness of thirty to one hundred nanometers (30-100 nm).

Figure 3:
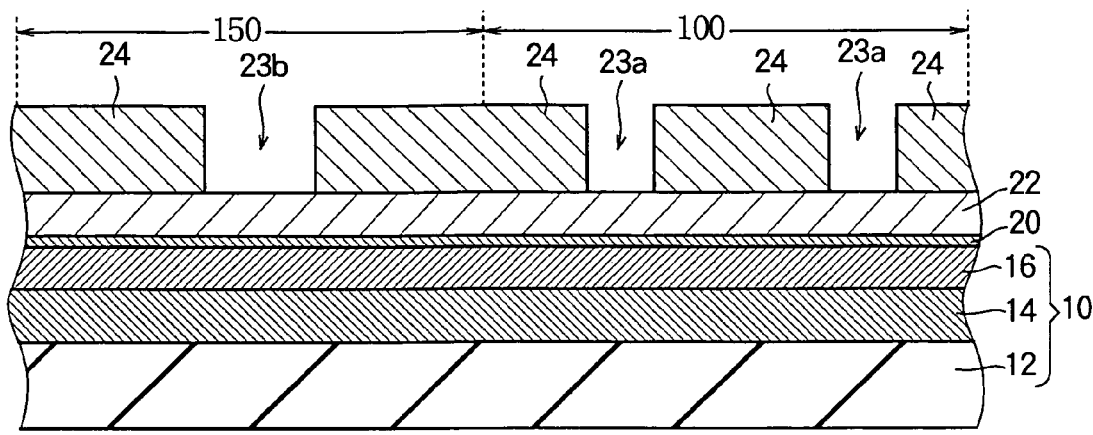
FIGS. 3, 4, 5, 6, 7, 8, 9, and 10 are sectional views illustrating steps in the fabrication process according to the first embodiment.

Referring to FIG. 3, next a silicon oxide film 20 is formed on the semiconductor silicon layer 16 in the circuit areas 100 and mark area 150 simultaneously. The silicon oxide film 20 may be formed by oxidizing the substrate 10 at a temperature of about 850 degrees Celsius, and may have a thickness of, for example, ten to thirty nanometers (10-30 nm). The silicon oxide film 20 prevents contamination of the substrate 10 and acts as a pad film by relieving some of the stress between the substrate 10 and the silicon nitride film 22 which will be formed next.

The silicon nitride film 22 is formed on the silicon oxide film 20 in the circuit areas 100 and the mark area 150 simultaneously. The silicon nitride film 22 may be formed by low-pressure chemical vapor deposition (LP-CVD) and may have a thickness of sixty to one hundred fifty nanometers (60-150 nm). The silicon nitride film 22 should be thick enough to protect the semiconductor silicon layer 16 during subsequent local oxidization, and to function as an etching mask during formation of the alignment marks 18.

Next, the entire silicon nitride film 22 is coated with a photoresist layer 24. The photoresist layer is exposed to light and developed to create openings 23a in the circuit areas 100 and openings 23b in the mark area 150, thus creating a mask pattern. The openings 23a in the circuit areas 100 define circuit element isolation regions, where field oxides will be formed later to isolate circuit elements. The openings 23b in the mark area 150 define the alignment marks 18 that will be formed therein.

Figure 4:
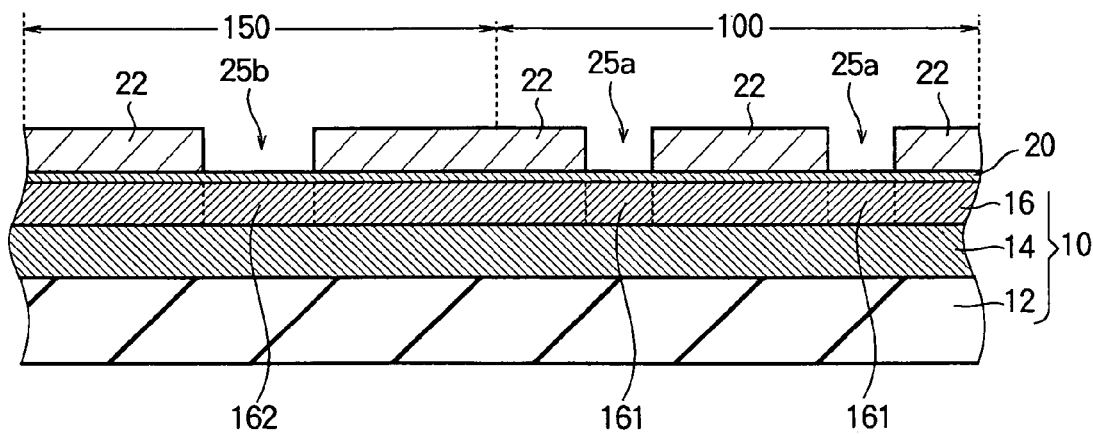

The silicon nitride film 22 is now etched where exposed by the photoresist mask 24, creating openings 25a, 25b that expose the silicon oxide film 20 in the circuit area 100 and mark area 150 as shown in FIG. 4. The photoresist mask 24 is removed after the completion of this etching step.

Figure 5:
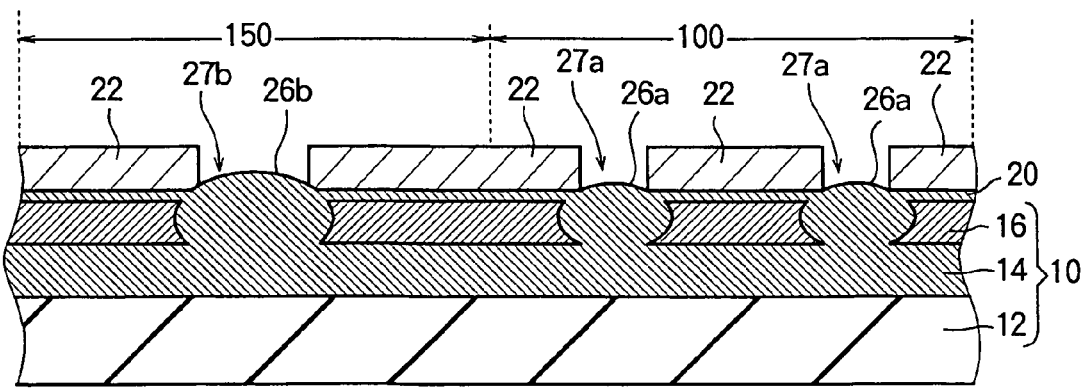

Next, the parts 161, 162 of the semiconductor silicon layer 16 disposed below the openings 25a, 25b in the silicon oxide film 20 are locally oxidized. FIG. 5 shows the result of this oxidation step, which forms oxidized areas 26a, 26b extending from the remaining openings 27a, 27b in the silicon oxide film 20 down to the insulator layer 14. The locally oxidized areas 26a in the circuit area 100 serve as field oxides that will isolate individual circuit elements. The locally oxidized areas 26b in the mark area 150 will be removed to form alignment marks.

Figure 6:
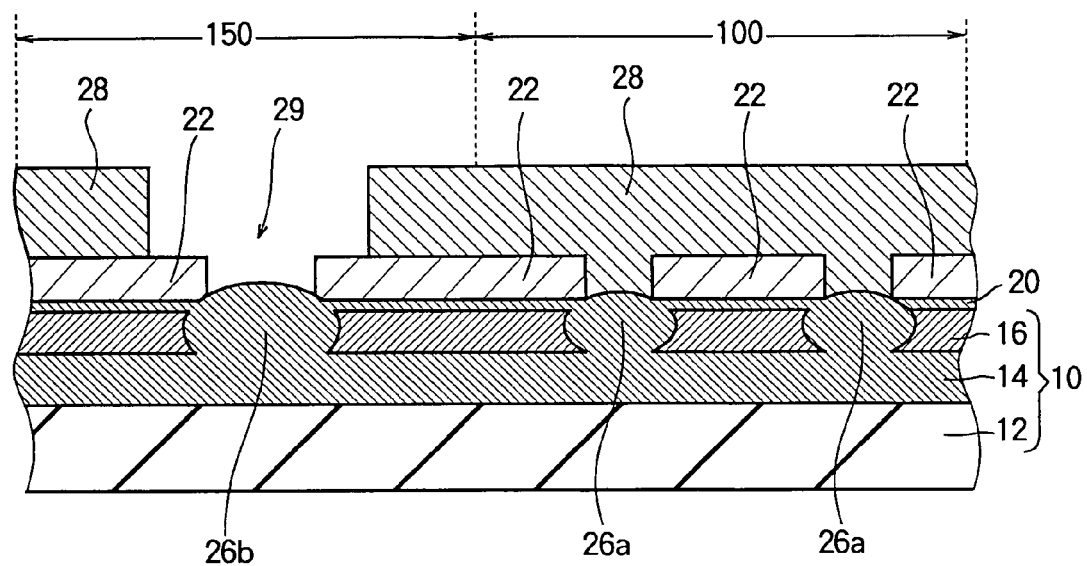

Next the wafer is coated with another photoresist layer, covering the silicon nitride film 22 and filling in the openings 27a, 27b left above the locally oxidized areas 26a, 26b in the circuit area 100 and mark area 150. This photoresist is exposed to light through a mask and developed to create a photoresist mask 28 as shown in FIG. 6, with openings 29 that expose the oxidized parts 26b of the semiconductor silicon layer 16 in the mark area 150. These openings 29 do not have to be defined with high accuracy; it is only necessary for them to uncover the oxidized parts 26b of the mark area 150 while leaving the circuit areas 100 covered, so there is considerable margin for positioning error.

These oxidized parts 26b and the insulator layer 14 below them are now etched by a dry etching process to expose the supporting silicon layer 12, the photoresist 28 and the remaining part of the silicon nitride film 22 functioning as an etching mask. The etching gas is, for example, a mixture of butylene ($C_4H_8$), oxygen ($O_2$) and argon (Ar), which selectively etches the oxide material. Alternatively, a wet etching process may be used with an etching solution such as an aqueous solution of hydrofluoric acid (HF) that etches silicon oxide at a faster rate than it etches the silicon nitride film 22 and supporting silicon layer 12. The photoresist mask 28 is removed after this etching step, leaving the wafer in the state shown in FIG. 7.

The necessary thickness of the silicon nitride film 22 is related to the thickness of the locally oxidized parts 26b of the semiconductor silicon layer 16 and the thickness of the insulator layer 14, which also comprises silicon oxide. If the silicon oxide is etched about ten times as rapidly as the silicon nitride film 22 that forms the etching mask, and if the oxidized parts 26b and the insulator layer 14 are both substantially 200 nm thick, so that their combined thickness is 400 nm, then the minimum necessary thickness of the silicon nitride film 22 is only about 40 nm, although a minimum of 50 nm is preferable to allow a tolerance for thickness variations in the film deposition process.

Next, the remaining silicon nitride film 22 is removed by, for example, wet etching with hot phosphoric acid ($H_3PO_4$), and the silicon oxide film 20 covering the semiconductor silicon layer 16 is removed by, for example, wet etching with an aqueous solution of hydrofluoric acid, leaving the wafer in the state shown in FIG. 2.

In the mark area 150, this process leaves concave alignment marks 18 extending from the surface of the semiconductor silicon layer 16 deep enough to expose the supporting silicon layer 12. The alignment marks 18 have adequately high edges 18a because they extend through the combined depth of the semiconductor silicon layer 16 and insulator layer 14.

The positions of the alignment marks 18 in this embodiment are determined by the positions of the openings in the silicon nitride film 22, so no new alignment step is needed when the alignment marks 18 are formed, and the occurrence of attendant alignment errors in the formation of the alignment marks 18 is prevented.

A method of using the alignment marks 18 as positioning references in the formation of gate electrodes will now be described.

Figure 8:
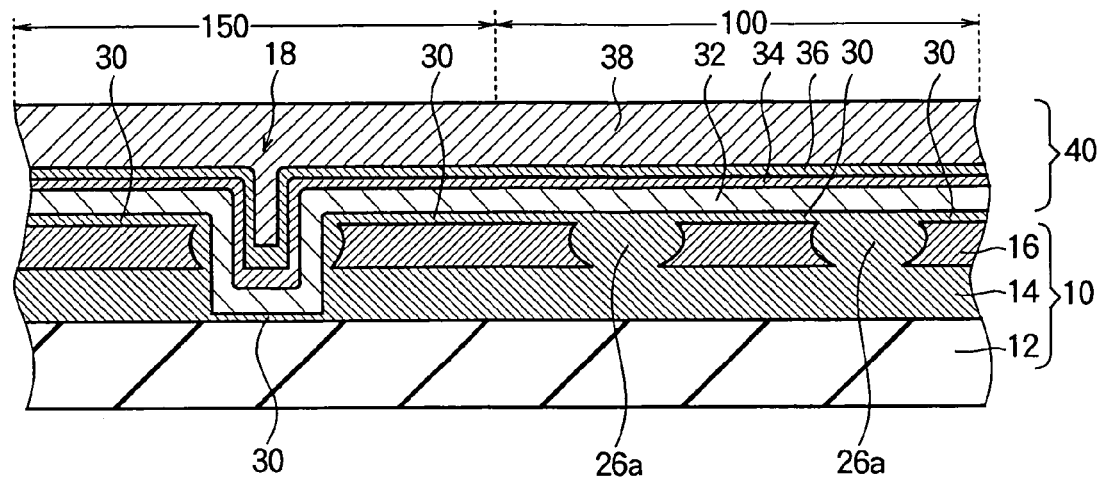

After the alignment marks 18 have been formed, a silicon oxide film 30 is formed so as to cover the surfaces of the silicon layers 12, 16 exposed in the circuit area 100 and mark area 150. This oxide film 30 will become the gate oxide that insulates the gate electrodes from the semiconductor silicon layer 16. A polysilicon film 32 and a tungsten silicide (WSi) film 34, for example, are deposited on the silicon oxide film 30 as gate material, and a silicon nitride film 36 is formed as a dielectric layer on the tungsten silicide film 34. A photoresist layer 38 is coated onto the silicon nitride film 36, filling in the alignment marks 18 and completing the formation of a lamination 40 that covers the entire substrate 10 as shown in FIG. 8.

The wafer is now placed in the exposure apparatus and aligned with a photomask (not shown) that defines the gate electrodes. In the alignment process, the photomask is roughly positioned above a circuit area 100, the substrate 10 is illuminated from above with light from a halogen lamp, a laser, or the like, the light reflected or diffracted from the alignment mark 18 adjacent to the circuit area 100 is detected, the position of the alignment mark 18 is compared with the position of a corresponding mark on the photomask, and the substrate 10 or the photomask is moved until the mark on the photomask is aligned in the desired position with respect to the alignment mark 18. Even though the alignment mark 18 is now filled in by the lamination 40, much more reflection and diffraction occurs at the edges 18a of the alignment mark 18 than occurs elsewhere, so the position of the alignment mark 18 can be detected accurately and the photomask can be accurately aligned.

The photoresist layer 38 is now exposed through the photomask to light of a wavelength that interacts with the photoresist layer 38. Next, the photomask is stepped to the next circuit area 100, by moving either the substrate 10 or the photomask itself, and the above alignment and exposure process is repeated. This step-and-repeat process continues until all of the circuit areas 100 on the substrate 10 have been exposed to light through the photomask.

Figure 9:
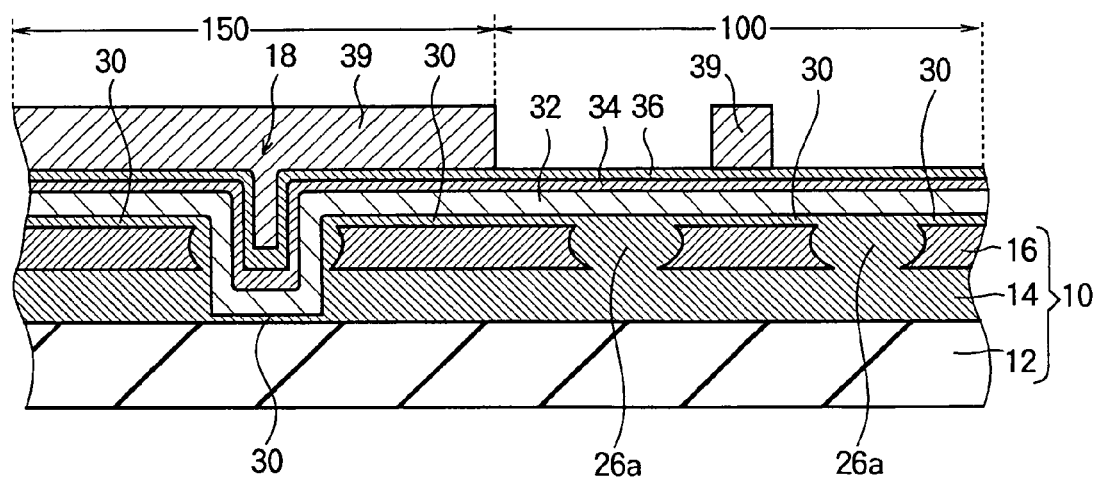

Next, the photoresist layer 38 is developed to form a mask 39 covering the areas in which the gate electrodes will be formed in the circuit area 100 (FIG. 9). If the alignment marks 18 will also be used as positional references when other features, such as contact holes, are formed after the gate electrodes have been formed, the photoresist mask 39 should also cover the mark area 150. The alignment marks 18 can then be used not only when the gate electrodes are formed, but also when various other steps in the semiconductor fabrication process are carried out, depending on the purpose and design of the semiconductor device.

Figure 10:
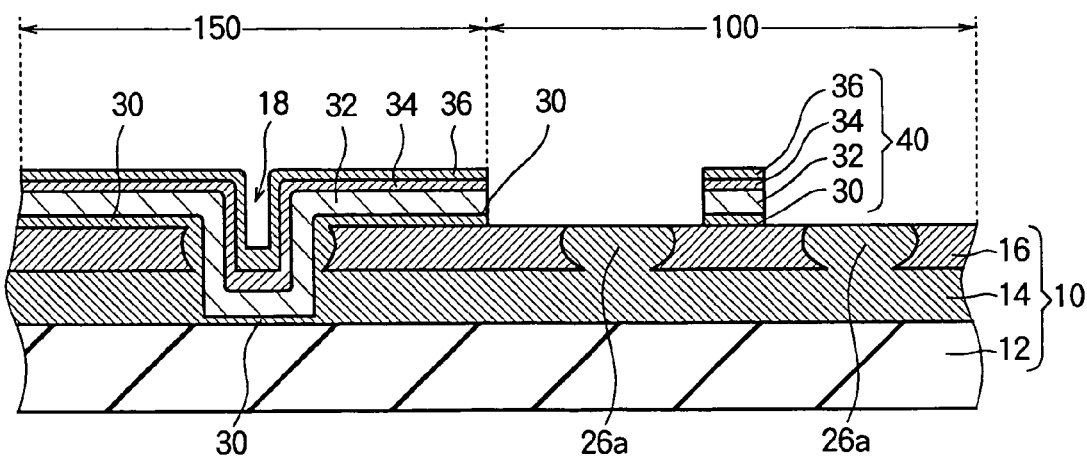

The exposed silicon nitride film 36, tungsten silicide film 34, polysilicon film 32, and silicon oxide film 30 are now removed by a sequence of etching steps to form gate electrodes 42 in the circuit area 100. After these etching steps, the photoresist mask 39 is removed, leaving the state shown in FIG. 10.

Compared with conventional processes that form alignment marks only in the semiconductor silicon layer 16, or only in the lower part of the insulator layer 14, this embodiment provides alignment marks that show up more sharply during the photomask alignment process, so that less alignment error occurs. The fabrication process is accordingly more reliable, the yield rate is improved, and the reliability of the fabricated integrated circuits is improved.

A further advantage of the first embodiment is that it uses the same photomask to define both the alignment marks 18 and the field oxides 26a. This is the photomask that patterns the photoresist 24 in FIG. 3. Accordingly, no extra fabrication steps are required to define the alignment marks, and no particular alignment process is necessary when either the alignment marks or the field oxides are defined.

Figure 7:
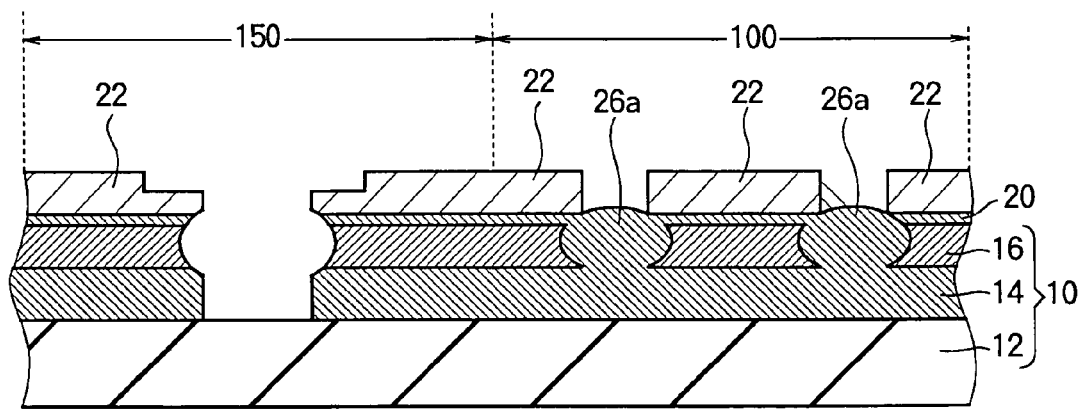

The only extra fabrication steps necessary for the formation of the alignment marks are the photolithography and etching steps illustrated in FIGS. 6 and 7, which remove oxide material 26b from the alignment marks after they have been defined. Because of the considerable margin for positioning error in the photolithography step in FIG. 6, however, this step can be completed quickly and easily, and does not require highly accurate exposure equipment.

SECOND EMBODIMENT

Figure 11:
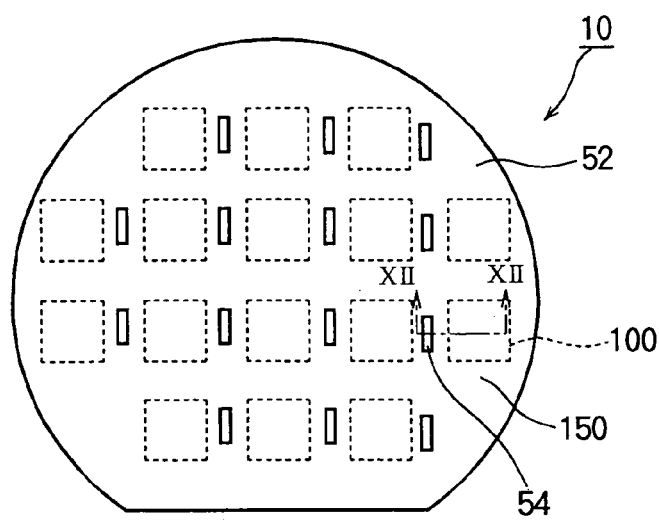
FIG. 11 is a plan view of a semiconductor wafer on which semiconductor integrated circuits are fabricated according to a second embodiment of the invention.
Figure 12:
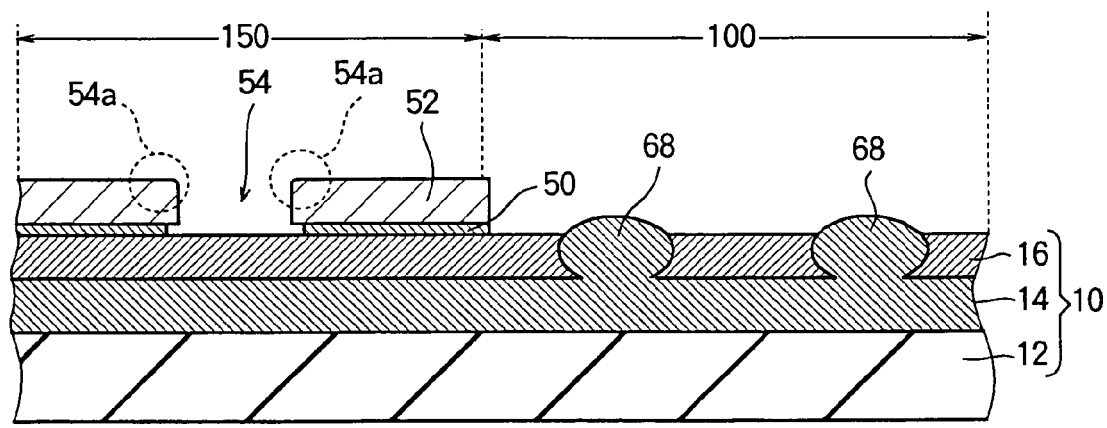
FIG. 12 is a sectional view through line XII-XII in FIG. 11.

Referring to the plan view in FIG. 11 and the sectional view in FIG. 12, the substrate 10 in the second embodiment has the same layout of circuit areas 100 and a mark area 150 as in the first embodiment, but the mark area 150 is covered by a silicon oxide film 50 and a silicon nitride film 52, in which the alignment marks 54 are formed. The alignment marks 54 extend through the silicon nitride film 52 and silicon oxide film 50, exposing the surface of the semiconductor silicon layer 16. The silicon nitride film 52 is thick enough to provide an adequate step height at the edges 54a of the alignment marks 54.

Field oxides 68 are formed in the silicon semiconductor layer 16 in the first area 100. As in the first embodiment, the field oxides provide local isolation for circuit elements (not shown) that will be formed later.

In the second embodiment, the semiconductor devices are fabricated as follows.

First, an SOI substrate 10 is prepared as in the first embodiment.

Figure 13:
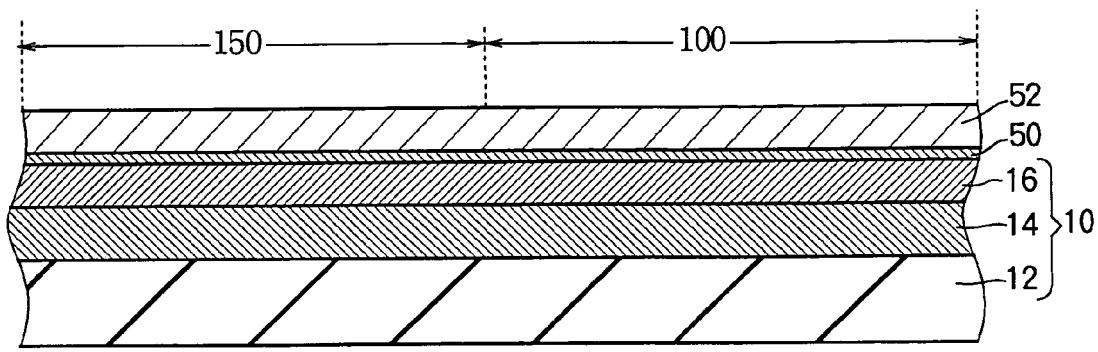
FIGS. 13, 14, 15, 16, 17, 18, 19, 20, 21, 22, and 23 are sectional views illustrating steps in the fabrication process according to the second embodiment.

Referring to FIG. 13, next a silicon oxide film 50 is formed as a pad oxide film on the semiconductor silicon layer 16 in the circuit areas 100 and the mark area 150 simultaneously, to a thickness of about ten to thirty nanometers (10-30 nm). The silicon oxide film 50 is thin enough to enable the semiconductor silicon layer 16 in the circuit areas 100 to be locally oxidized in a later step to form circuit element isolation regions.

Next a silicon nitride film is formed on the silicon oxide film 50 as in the first embodiment. This first silicon nitride film 52 may be formed by low-pressure chemical vapor deposition (LP-CVD) and may have a thickness of 60-150 nm. The first silicon nitride film 52 should be thick enough to prevent the semiconductor silicon layer 16 from being oxidized in the mark area 150 when the circuit element isolation regions are formed in the circuit areas 100.

Figure 14:
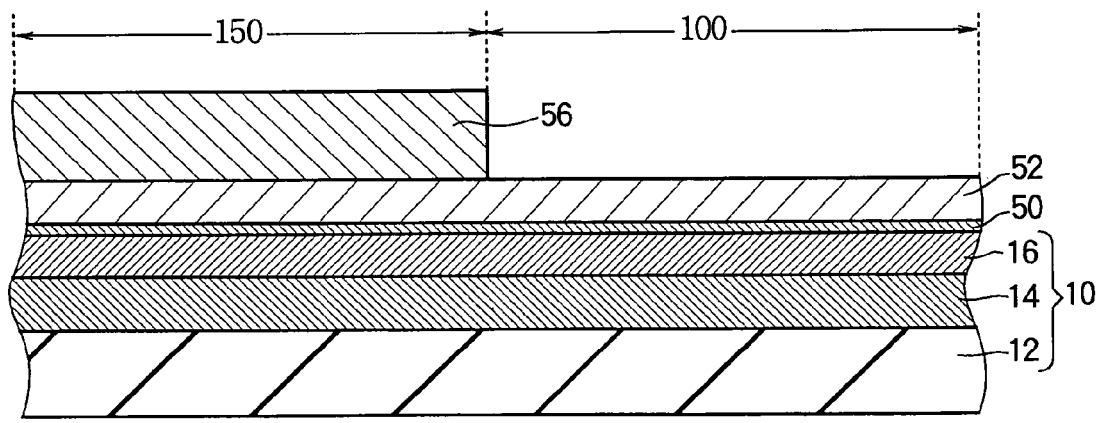

Next, the entire first silicon nitride film 52 is coated with a photoresist layer. The photoresist layer is exposed to light and developed to create a photoresist mask 56 that covers the mask area 150 and exposes the circuit areas 100 as shown in FIG. 14.

Figure 15:
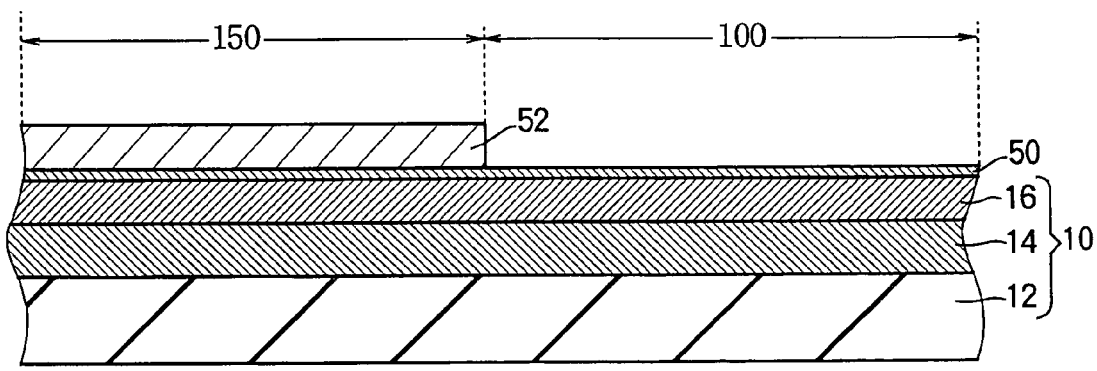

The first silicon nitride film 52 is now removed from the circuit areas 100 by etching with this photoresist mask 56 as an etching mask. After the etching step, the photoresist mask 56 is removed as shown in FIG. 15.

Figure 16:
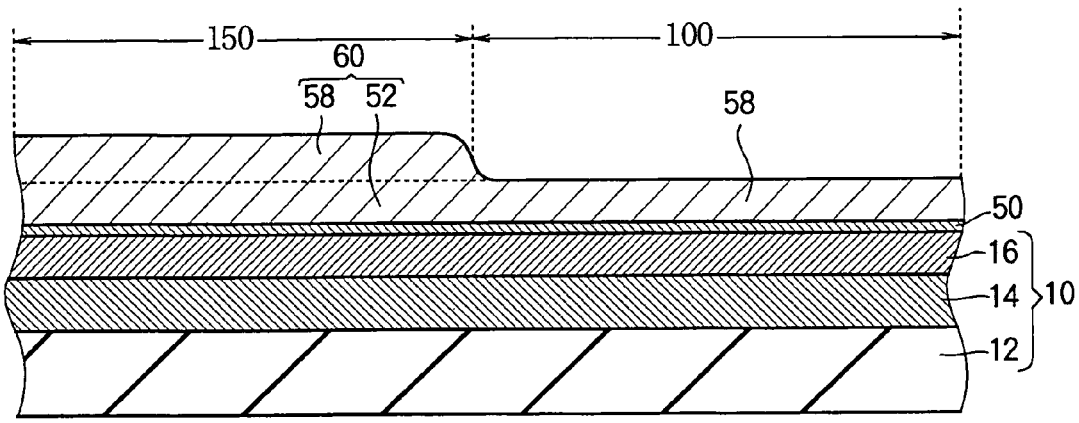

Next, a second silicon nitride film 58 is formed by LP-CVD on the silicon oxide film 50 in the circuit areas 100 and on the first silicon nitride film 52 in the mark area 150 as shown in FIG. 16. The second silicon nitride film 58 should be thick enough to prevent parts other than circuit element isolation regions of the semiconductor silicon layer 16 from being oxidized when the field oxides are formed in the circuit areas 100 in a later process step. For example, the second silicon nitride film 58 may have a thickness of 60-150 nm.

In the mark area 150, the second silicon nitride film 58 is a continuation of the first silicon nitride film 52 that has already been formed. The first silicon nitride film 52 and the second silicon nitride film 58 together constitute a combined silicon nitride film 60. The entire substrate 10 is now covered by a film of silicon nitride having a first thickness in the circuit area 100 and a second thickness, greater than the first thickness, in the mark area 150. If the first and second silicon nitride films 52, 58 have the same thickness, for example, then the thickness of the silicon nitride film 60 in the mark area 150 is twice the thickness of the silicon nitride film 58 in the circuit area 100.

Figure 17:
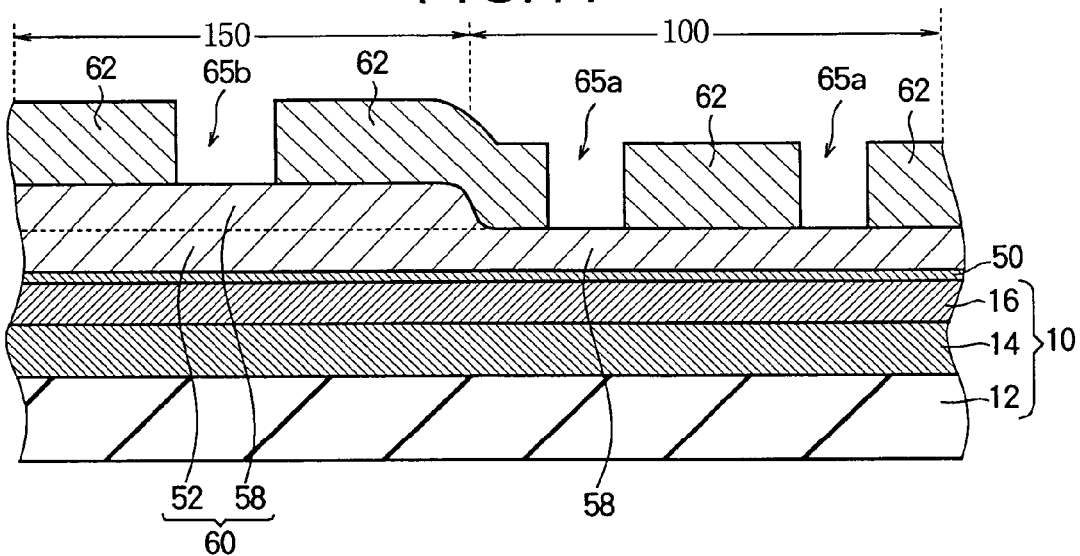

Next, a photoresist layer is coated into the wafer, covering the second silicon nitride film 58 in the circuit areas 100 and the combined silicon nitride film 60 in the mark area 150. The photoresist layer is exposed to light and developed to create a photoresist mask 62 having openings 65a and 65b exposing parts of the second silicon nitride film 58 and the combined silicon nitride film 60 as shown in FIG. 17. The openings 65a in the circuit areas 100 are positioned over circuit element isolation regions in the substrate 10, which will be locally oxidized as described later. The openings 65b in the mark area 150 are positioned over the regions in which concavities will be formed as alignment marks on the substrate 10.

Figure 18:
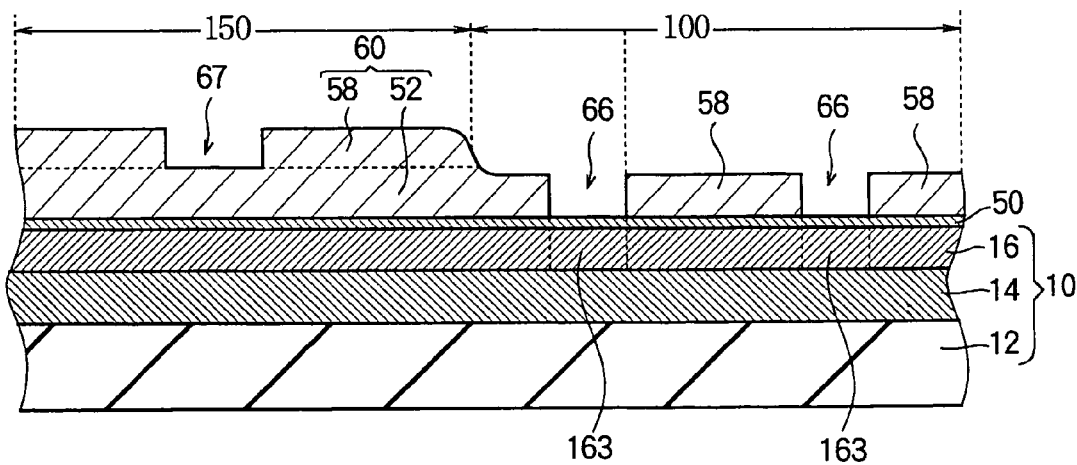

The silicon nitride film 58, 60 is now etched with the photoresist mask 62 as an etching mask to create openings 66 exposing the silicon oxide film 50 in the circuit areas 100 as shown in FIG. 18. A dry etching process may be carried out with a mixture of trifluoromethane ($CHF_3$), oxygen ($O_2$), and argon (Ar) as the etching gas. In the mark area 150, openings 67 are formed in the silicon nitride film 60 by etching through the second silicon nitride film 58 to the surface of the first silicon nitride film 52. After the etching process, the photoresist mask 62 is removed.

Figure 19:
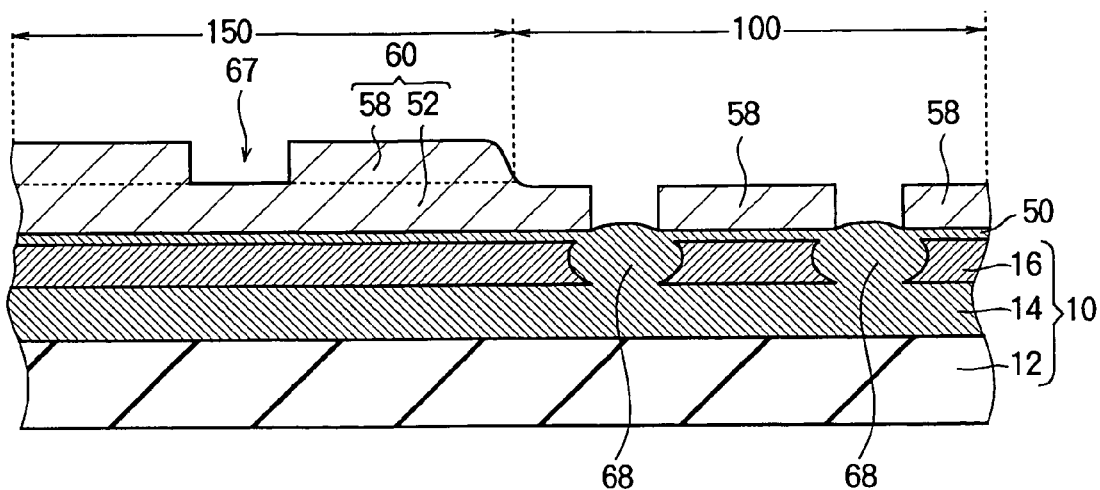

Next, with the silicon nitride film 60 still covering all of the mark area 150, the parts 163 of the semiconductor silicon layer 16 that face the openings 66 in the second silicon nitride film 58 in the circuit areas 100 are locally oxidized. The result, as shown in FIG. 19, is that field oxides 68 are formed in the circuit element isolation regions in the circuit areas 100. Oxidation proceeds to a depth sufficient for the field oxides 68 to merge with the insulator layer 14.

Figure 20:
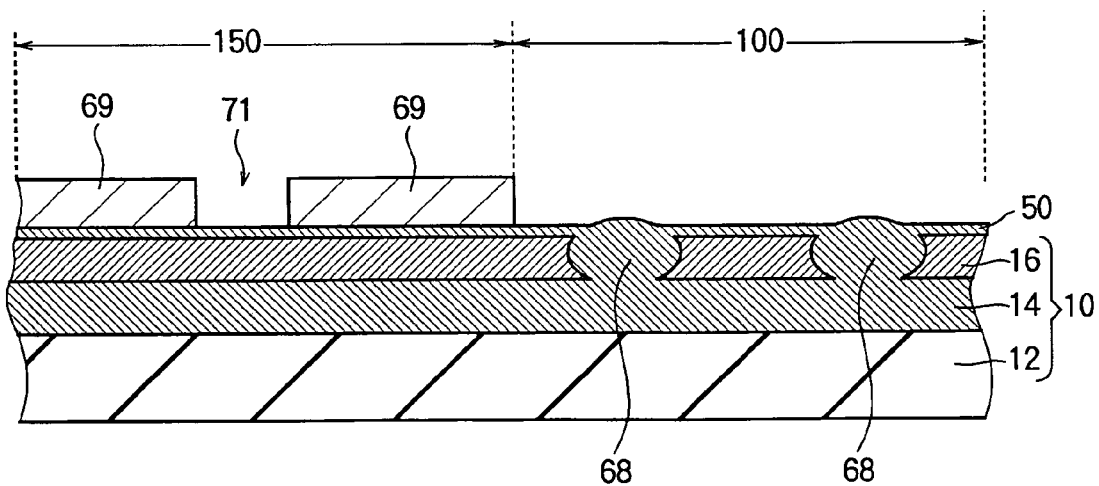

Next, the second silicon nitride film 58 that remains in the circuit areas 100 is removed by wet etching with, for example, hot phosphoric acid. The silicon nitride film 60 in the mark area 150 is etched simultaneously, leaving a silicon nitride film 69 having openings 71 exposing the silicon oxide film 50 at positions corresponding to the openings 67 in the silicon nitride film 60 before the etching step, as shown in FIG. 20.

Next, the exposed parts of the silicon oxide film 50 are removed by wet etching with a hydrofluoric acid solution, for example. The silicon oxide film 50 is thereby entirely removed from the circuit areas 100. In the mark area 150, the silicon oxide film 50 is removed from the floors of the openings 71. This process leaves alignment marks 54 with heights equal to the combined thickness of the remaining silicon nitride film 69 (the remaining part of the first silicon nitride film 52) and oxide film 50, as shown in FIG. 12. Because wet etching is isotropic, the walls of the silicon oxide film 50 may be etched laterally, as shown in FIG. 12, but this does not affect the performance of the alignment marks.

The height of the edges 54a of the alignment marks 54 in FIG. 12 is determined by the thickness of the oxide film 50 and the first and second nitride films 52, 58, and is not limited by the thickness of the semiconductor silicon layer 16. An edge height of at least 100 nm is preferable to permit precise detection of reflected or diffracted light from the edges of the alignment mark 54 in later alignment processes.

Next, a method of forming gate electrodes positioned with reference to the positions of the alignment marks 54 will be described.

Figure 21:
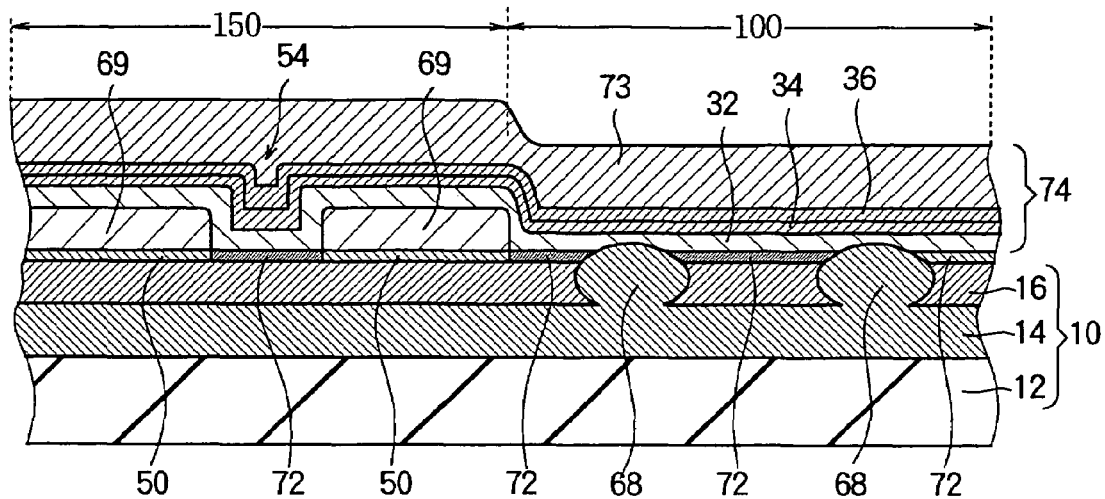

To form gate electrodes, first, after the alignment marks 54 are formed, a silicon oxide film 72 is formed as a gate oxide film on the exposed surface of the semiconductor silicon layer 16 in the circuit areas 100 and alignment marks 54, as shown in FIG. 21. Then a polysilicon film 32 and a tungsten silicide film 34 are deposited as gate electrode material on the surface of the remaining silicon nitride film 69, the field oxides 68, and the silicon oxide film 72, and a silicon nitride film 36 is deposited as an dielectric. A photoresist layer 73 is coated onto the silicon nitride film 36 to complete a lamination 74 that covers the entire substrate 10, filling in the alignment marks 54.

Next, the wafer is aligned with alignment marks on a photomask (not shown) and the photoresist layer 73 is exposed by a step-and-repeat process as described in the first embodiment. In the alignment process, the positions of the alignment marks 54 are found by directing light from a halogen lamp or laser onto the lamination 74 and detecting the reflected or diffracted light. This embodiment makes it possible to detect the positions of the alignment marks 54 with high accuracy since the amount of light reflected and diffracted from the edges of the alignment marks 54 is much larger than the amount of light reflected and diffracted from other regions. As a result, the wafer and the photomask can be aligned accurately.

Figure 22:
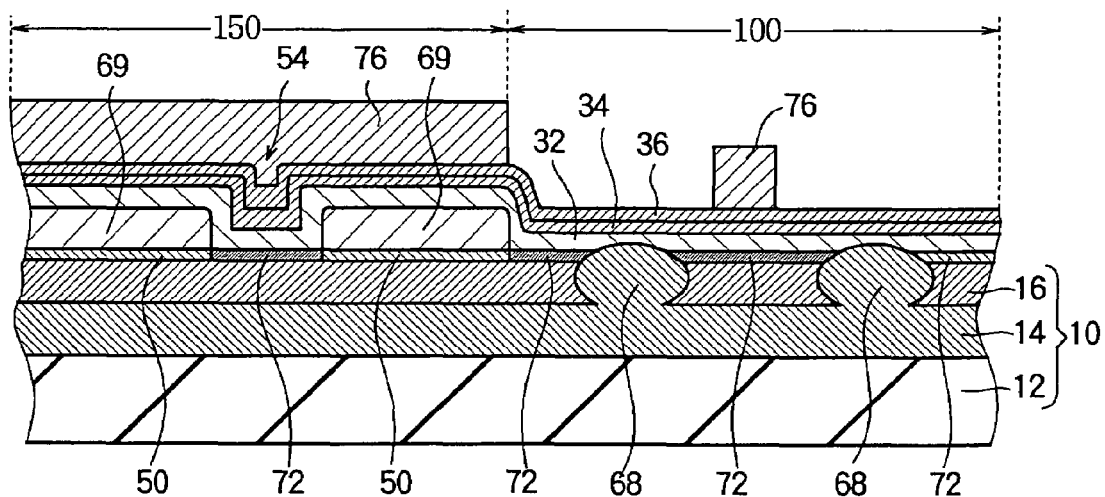

Next, the photoresist layer 73 is developed to form a photoresist mask 76 covering the areas in which gate electrodes are to be formed in the circuit areas 100, as shown in FIG. 22. If the alignment marks 54 will also be used to align contact holes and other features, this photoresist mask 76 should also cover the mark area 150, as shown, to protect the silicon nitride film 69 remaining in the mark area 150.

Figure 23:
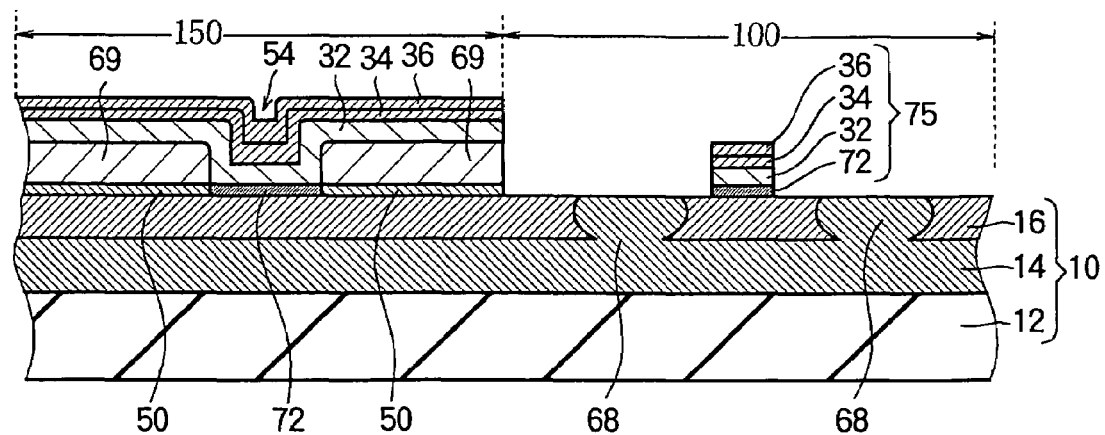

Next, the photoresist mask 76 is used as a mask to etch the exposed silicon nitride film 36, tungsten silicide film 34, polysilicon film 32, and silicon oxide film 72 sequentially to form gate electrodes 75 as shown in FIG. 23. After the completion of this etching step, the photoresist mask 76 is removed.

The second embodiment provides the same effects as the first embodiment. In addition, because the alignment marks are not formed in the semiconductor silicon layer 16, the semiconductor silicon layer can be thinner than in the first embodiment, improving the performance of the completed semiconductor device.

In a variation of the preceding embodiments, when the gate electrodes are formed, a plurality of circuit areas 100 are exposed at once. The alignment marks are used in substantially the same way to align the circuit areas with the photomask.

Those skilled in the art will recognize that further variations are possible within the scope of the invention, which is defined in the appended claims.

What is claimed is:

1. A method of fabricating a semiconductor device, comprising:
    preparing a substrate having a supporting layer, an insulator layer disposed on the supporting layer, and a semiconductor layer disposed on the insulator layer, the substrate including a first area for formation of circuit elements and a second area for formation of an alignment mark adjacent the first area;
    forming a nitride film on the substrate in the first area and the second area;
    patterning the nitride film to form a first opening in the nitride film partially exposing the substrate in the first area, and a second opening in the nitride film in the second area;
    locally oxidizing the semiconductor layer below the first opening to form an isolation region in the first area and below the second opening in the second area; and
    removing the oxidized semiconductor layer below the second opening to form the alignment mark,
    wherein the alignment mark is defined by edges of the semiconductor layer remaining after said removing, said removing being performed while the edges are protected by the nitride film.

2. The method of claim 1, wherein the semiconductor layer is a silicon layer.

3. The method of claim 1, wherein the semiconductor layer has a thickness of thirty to one hundred nanometers.

4. The method of, claim 1, wherein the nitride film has a thickness of at least fifty nanometers.

5. The method of claim 1, further comprising forming an oxide film on the semiconductor layer, the nitride film being formed on the oxide film.

6. The method of claim 5, wherein the second opening extends through the nitride film to the oxide film, and
    said removing also removes the insulator layer below the second opening.

7. The method of claim 6, further comprising:
    forming a photoresist mask covering the first area and exposing the second opening in the nitride film in the second area, before said removing; and
    removing the photoresist mask and the nitride film after said removing, the alignment mark thus being formed as an opening in the semiconductor layer and the insulator layer.

8. The method of claim 6, further comprising:
    forming a photoresist mask covering the first area and exposing the second opening in the nitride film in the second area, before said etching; and
    removing the photoresist mask and the nitride film after said etching.

9. The method of claim 1, further comprising forming circuit elements in the first area of the substrate, using the alignment mark as a positioning reference.

10. A method of fabricating a semiconductor device, comprising:
    preparing a substrate having a supporting layer, an insulator layer disposed on the supporting layer, and a semiconductor layer disposed on the insulator layer, the substrate including a first area for formation of circuit elements and a second area for formation of an alignment mark adjacent the first area;
    forming an oxide film on the semiconductor layer;
    forming a nitride film on the oxide film in the first area and the second area, the nitride film having a first thickness in the first area and a second thickness in the second area, the second thickness being greater than the first thickness;
    patterning the nitride film to form a first opening partially exposing the oxide film in the first area and a second opening in at least an upper part of the nitride film in the second area, wherein the second opening extends only partway through the nitride film;
    locally oxidizing the semiconductor layer below the first opening to form an isolation region in the first area; and
    etching the nitride film that remains in the second opening, and the substrate below the second opening, to form the alignment mark.

11. The method of claim 10, wherein the second thickness is substantially twice the first thickness.

12. The method of claim 10, wherein forming the nitride film comprises:
    forming a first nitride film on the oxide film;
    masking the first nitride film in the second area;
    removing the first nitride film from the first area by etching; and
    forming a second nitride film on the oxide film in the first area and on the first nitride film in the second area, the nitride film thus including the first nitride film in the first area and both the first and second nitride films in the second area.

13. The method of claim 10, further comprising removing the oxide film from the first area and from the alignment mark in the second area.

14. The method of claim 13, wherein the alignment mark has a depth of at least one hundred nanometers.

15. A method of fabricating a semiconductor device, comprising:
    preparing a substrate having a supporting layer, an insulator layer disposed on the supporting layer, and a semiconductor layer disposed on the insulator layer, the substrate including a first area for formation of circuit elements and a second area for formation of an alignment mark adjacent the first area;

forming an oxide film on the semiconductor layer;

forming a nitride film on the oxide film in the first area and the second area;

patterning the nitride film to form a first opening partially exposing the oxide film in the first area, and a second opening in the second area;

locally oxidizing the semiconductor layer to form an isolation region below the first opening in the first area, and an oxidized region below the second opening in the second area; and etching the substrate to remove the oxidized region and the insulator layer below the second opening, to thus form the alignment mark.

16. The method of claim 15, further comprising forming circuit elements in the first area of the substrate, using the alignment mark as a positioning reference.

17. The method of claim 15, wherein the semiconductor layer is a silicon layer.

18. The method of claim 15, wherein the semiconductor layer has a thickness of thirty to one hundred nanometers.

19. The method of claim 15, wherein the nitride film has a thickness of at least fifty nanometers.

* * * * *